US011952678B2

(12) United States Patent
Kaneko (10) Patent No.: US 11,952,678 B2
(45) Date of Patent: Apr. 9, 2024

(54) METHOD FOR MANUFACTURING ETCHED SiC SUBSTRATE AND GROWN SiC SUBSTRATE BY MATERIAL TRANPORTATION AND METHOD FOR EPITAXIAL GROWTH BY MATERIAL TRANSPORTATION

(71) Applicants: KWANSEI GAKUIN EDUCATIONAL FOUNDATION, Hyogo (JP); TOYOTA TSUSHO CORPORATION, Nagoya (JP)

(72) Inventor: Tadaaki Kaneko, Hyogo (JP)

(73) Assignees: KWANSEI GAKUIN EDUCATIONAL FOUNDATION, Hyogo (JP); TOYOTA TSUSHO CORPORATION, Nagoya (JP)

( * ) Notice: Subject to any disclaimer, the term of this patent is extended or adjusted under 35 U.S.C. 154(b) by 105 days.

(21) Appl. No.: 17/606,738

(22) PCT Filed: Apr. 24, 2020

(86) PCT No.: PCT/JP2020/017642
§ 371 (c)(1),
(2) Date: Oct. 26, 2021

(87) PCT Pub. No.: WO2020/218482
PCT Pub. Date: Oct. 29, 2020

(65) Prior Publication Data
US 2022/0213615 A1    Jul. 7, 2022

(30) Foreign Application Priority Data
Apr. 26, 2019    (JP) .............................. JP2019-086713

(51) Int. Cl.
*C30B 23/06* (2006.01)
*C30B 25/10* (2006.01)
(Continued)

(52) U.S. Cl.
CPC .............. *C30B 25/20* (2013.01); *C30B 25/10* (2013.01); *C30B 29/36* (2013.01)

(58) Field of Classification Search
CPC ..... C30B 23/00; C30B 23/002; C30B 23/005; C30B 23/02; C30B 23/025; C30B 23/06;
(Continued)

(56) References Cited

U.S. PATENT DOCUMENTS

2009/0038538 A1* 2/2009 Kaneko ................... C30B 19/04
117/54
2011/0278594 A1* 11/2011 Nishiguchi ....... H01L 21/02631
117/106

FOREIGN PATENT DOCUMENTS

JP    2000 053493 A    2/2000
JP    2007112661 A    5/2017
(Continued)

OTHER PUBLICATIONS

International Search Report of PCT/JP2020/017642 dated Jul. 28, 2020 (2 pages).
(Continued)

*Primary Examiner* — Kenneth A Bratland, Jr.
(74) *Attorney, Agent, or Firm* — Calfee, Halter & Griswold LLP (57) ABSTRACT

The present invention addresses the problem of providing a novel method for manufacturing a SiC substrate, and a manufacturing device for said method. The present invention realizes: a method for manufacturing a SiC substrate, comprising heating two mutually opposing SiC single-crystal substrates and transporting a raw material from one SiC single-crystal substrate to the other SiC single-crystal substrate; and a manufacturing device for said method. Through the present invention, each of the mutually opposing SiC single-crystal substrate surfaces can be used as a raw material for crystal growth of the other SiC single-crystal sub- (Continued)

strate surface, and it is therefore possible to realize a highly economical method for manufacturing a SiC substrate.

12 Claims, 6 Drawing Sheets

(51) Int. Cl.
*C30B 25/20* (2006.01)
*C30B 29/36* (2006.01)

(58) Field of Classification Search
CPC ..... C30B 23/063; C30B 23/066; C30B 25/00; C30B 25/02; C30B 25/10; C30B 25/18; C30B 25/20; C30B 29/00; C30B 29/10; C30B 29/36; C23C 14/00; C23C 14/06; C23C 14/0635; C23C 14/22; C23C 14/24

USPC ......... 117/84, 88, 94, 97, 99, 101–102, 106, 117/200, 204, 937, 951
See application file for complete search history.

(56) References Cited

FOREIGN PATENT DOCUMENTS

| JP | 2018158858 A | * | 10/2018 |
|----|--------------|---|---------|
| JP | 2018158858 A |   | 10/2018 |
| WO | 2014020694 A1 |  | 2/2014 |
| WO | 2017188381 A1 |  | 11/2017 |

OTHER PUBLICATIONS

European Search Report from European Application No. 20793980.2 dated Mar. 31, 2023 (7 pages).

* cited by examiner

METHOD FOR MANUFACTURING ETCHED SiC SUBSTRATE AND GROWN SiC SUBSTRATE BY MATERIAL TRANPORTATION AND METHOD FOR EPITAXIAL GROWTH BY MATERIAL TRANSPORTATION

CROSS-REFERENCE TO RELATED APPLICATIONS

This application is a 371 of PCT Application No. PCT/JP2020/017642, filed on Apr. 24, 2020, which claims priority to Japanese Application No. 2019-086713, filed on Apr. 26, 2019, the contents of which are hereby incorporated by reference as if recited in their entirety.

TECHNICAL FIELD

The present invention relates to a method for manufacturing an SiC substrate, a manufacturing apparatus therefor, and an epitaxial growth method.

BACKGROUND ART

Silicon carbide (SiC) semiconductor devices have a higher withstand voltage and higher efficiency than silicon (Si) and gallium arsenide (GaAs) semiconductor devices, and are capable of operating at higher temperature, and thus have attracted attention as high-performance semiconductor devices.

Typically, the SiC semiconductor devices are fabricated by an SiC crystal growth. Various growth methods have been proposed for SiC crystal growth.

In a vapor phase epitaxial growth method described in Patent Literature 1, in a state where an SiC container made of a material containing SiC polycrystal is housed in a TaC container made of a material containing TaC, and a base substrate is housed in the SiC container, the TaC container is heated in an environment where an Si vapor pressure is held in the TaC container and a temperature gradient is generated. As a result, C atoms sublimated by etching an inner surface of the SiC container and Si atoms in the atmosphere are bonded to each other, so that an epitaxial layer of 3C—SiC single crystal is grown on the base substrate.

CITATION LIST

Patent Literature

Patent Literature 1: JP 2017-188381 T

SUMMARY OF INVENTION

Technical Problem

However, in the invention described in Patent Literature 1, since the SiC container, which is the raw material in the crystal growth, is consumed every time it undergoes a growth process, there is room for improvement from the viewpoint of economic efficiency.

An object of the present invention is to provide a novel method and apparatus for manufacturing an SiC substrate, and epitaxial growth method.

Solution to Problem

In order to solve the above problems, the present invention heats two SiC single crystal substrates facing each other, and transports a raw material from one SiC single crystal substrate to the other SiC single crystal substrate.

As a result, the surfaces of the SiC single crystal substrates facing each other can be used as raw materials for crystal growth, so a method for manufacturing an SiC substrate excellent in economic efficiency can be realized.

In a preferred embodiment of the present invention, the two SiC single crystal substrates are heated so that the one SiC single crystal substrate is on a high temperature side and the other SiC single crystal substrate is on a low temperature side.

As a result, it is possible to realize a raw material transport using a temperature gradient between the two SiC single crystal substrates as a driving force.

In a preferred embodiment of the present invention, the two SiC single crystal substrates are disposed and heated in a quasi-closed space.

As a result, the raw material transport between the two SiC single crystal substrates can be realized in the quasi-closed space.

In a preferred embodiment of the present invention, the two SiC single crystal substrates are disposed and heated in a main container made of an SiC material.

As a result, a vapor pressure of a gas phase species containing an Si element and a gas phase species containing a C element can be generated in the raw material transport space formed between the SiC single crystal substrates.

In a preferred embodiment of the present invention, the two SiC single crystal substrates are disposed and heated in the quasi-closed space in which an atomic number ratio Si/C exceeds 1.

As a result, the raw material is suitably transported under an SiC—Si equilibrium vapor pressure environment. Note that the SiC—Si equilibrium vapor pressure environment will be described later in detail.

In a preferred embodiment of the present invention, the two SiC single crystal substrates are disposed and heated in the quasi-closed space in which the atomic number ratio Si/C is 1 or less.

As a result, the raw material is suitably transported under the SiC—Si equilibrium vapor pressure environment. Note that the SiC—Si equilibrium vapor pressure environment will be described later in detail.

In order to solve the above problems, the present invention includes a main container capable of housing a plurality of SiC single crystal substrates, in which the main container includes an installation tool capable of installing two adjacent SiC single crystal substrates so as to face each other.

As a result, the surfaces of the SiC single crystal substrates facing each other can be used as raw materials for crystal growth, so that an apparatus for manufacturing an SiC substrate excellent in economic efficiency can be realized.

In a preferred embodiment of the present invention, the main container is made of a material containing an Si atom and a C atom.

As a result, a vapor pressure of a gas phase species containing an Si element and a gas phase species containing a C element can be generated in the raw material transport space formed between the SiC single crystal substrates.

In a preferred embodiment of the present invention, the installation tool is made of a material containing an Si atom and a C atom.

As a result, it is possible to generate a vapor pressure of the gas phase species containing the Si element and the gas phase species containing the C element in the raw material transport space.

In a preferred embodiment of the present invention, the installation tool can be installed so that two adjacent SiC single crystal substrates are substantially parallel.

As a result, it is possible to make a flux of the raw material transport between the adjacent SiC single crystal substrates substantially uniform.

In a preferred embodiment of the invention, the main container has an Si vapor source.

As a result, it is possible to set the raw material transport space to the SiC—Si equilibrium vapor pressure environment.

In a preferred embodiment of the present invention, the apparatus for manufacturing an SiC substrate further includes a heating furnace capable of heating the main container so that one of the two adjacent SiC single crystal substrates is on the high temperature side and the other of the SiC single crystal substrates is on the low temperature side.

As a result, it is possible to realize a raw material transport using a temperature gradient between the two SiC single crystal substrates as a driving force.

In a preferred embodiment of the present invention, the heating furnace includes a high melting point container capable of housing the main container.

As a result, it is possible to hold the desired vapor pressure environment.

In addition, the present invention also relates to an epitaxial growth method. That is, according to an aspect of the present invention, an epitaxial growth method includes transporting a raw material from one SiC single crystal substrate to the other SiC single crystal substrate, and crystal-growing the other SiC single crystal substrate by taking over a polymorph of the other SiC single crystal substrate.

In a preferred embodiment of the present invention, heating is performed so that one SiC single crystal substrate is on the high temperature side and the other SiC single crystal substrate is on the low temperature side.

In a preferred embodiment of the present invention, the SiC single crystal substrate is disposed and grown in a raw material transport space exhausted via an Si vapor pressure space.

In a preferred embodiment of the present invention, the SiC single crystal substrate is disposed and heated in a quasi-closed space.

In a preferred embodiment of the present invention, the SiC single crystal substrate is disposed and heated in the quasi-closed space in which the atomic number ratio Si/C exceeds 1.

In a preferred embodiment of the present invention, the SiC single crystal substrate is disposed and heated in the quasi-closed space in which the atomic number ratio Si/C of 1 or less.

In a preferred form of the invention, the high melting point vessel has an Si vapor supply material.

As a result, it is possible to hold the desired vapor pressure environment.

Advantageous Effects of Invention

According to the disclosed technology, it is possible to provide a novel method for manufacturing an SiC substrate, manufacturing apparatus therefor, and epitaxial growth method.

Other problems, features and advantages will become apparent from a reading of the following detailed description when taken in conjunction with the drawings and claims.

DESCRIPTION OF EMBODIMENTS

Hereinafter, a preferred embodiment of the present invention illustrated in the drawings will be described in detail with reference to FIGS. 1 to 9. The technical scope of the present invention is not limited to the embodiments illustrated in the accompanying drawings, and can be appropriately changed within the scope described in the claims.

<<Method for Manufacturing SiC Substrate>>

Hereinafter, a method of manufacturing an SiC substrate (Hereinafter, it is simply referred to as a manufacturing method) according to an embodiment of the present invention will be described in detail.

The present invention can be understood as a manufacturing method for performing etching and crystal growth of SiC single crystal substrates 11 and 12 by heating the SiC single crystal substrates 11 and 12 facing each other and transporting a raw material between the SiC single crystal substrates 11 and 12.

Specifically, the manufacturing method includes an installation process of installing the SiC single crystal substrates 11 and 12 so as to face each other, and a heating process of transporting a raw material between the SiC single crystal substrates 11 and 12 by heating.

<Installation Process>

An installation process according to the embodiment of the present invention is a process of installing one SiC single crystal substrate 11 and the other SiC single crystal substrate 12 so as to face (opposite to) each other. These SiC single crystal substrates 11 and 12 are preferably installed so as to be adjacent to each other and substantially parallel to each other.

<SiC Single Crystal Substrate>

Hereinafter, the SiC single crystal substrates 11 and 12 will be described in detail.

Examples of the SiC single crystal substrates 11 and 12 include SiC wafers obtained by slicing an ingot fabricated by a sublimation method or the like into a disk shape, or SiC substrates obtained by processing an SiC single crystal into a thin plate shape. Note that as a crystal polymorph of the SiC single crystal, any polytype can be adopted.

As the surface of the SiC single crystal substrate, a surface provided with an off angle of several degrees (for example, 0.4 to 8°) from a (0001) surface or a (000-1) surface can be exemplified (note that in the present specification, in a notation of the Miller indices, "-" means a bar attached to an index immediately after the Miller indices).

A step-terrace structure is confirmed on the surface of the SiC single crystal substrate surface flattened at an atomic level. The step-terrace structure is a staircase structure in which a step that is a step portion of one or more molecular layers and a terrace that is a flat portion where a {0001} surface is exposed are alternately arranged.

In a step, on molecular layer (0.25 nm) has a minimum height (minimum unit), and a plurality of molecular layers overlap to form various step heights. In the description of the present specification, a step that becomes large by bundling (bunching) and has a height exceeding one unit cell of each polytype is referred to as macro step bunching (MSB).

That is, the MSB is a step of bunching more than four molecular layers (equal to or larger than five molecular layers) in a case of 4H—SiC, and is a step of bunching more than six molecular layers (equal to or larger than seven layers) in a case of 6H—SiC.

The MSB is preferably not formed on the surface of the SiC single crystal substrate because defects due to the MSB occur on the surface during the formation of the growth layer or the MSB is one of factors of inhibiting oxide film reliability in the SiC semiconductor device.

As the sizes of the SiC single crystal substrates 11 and 12, wafer sizes of 6 inches or more, such as 6 inches and 8 inches, can be exemplified from a chip size of several centimeters square.

The SiC single crystal substrate 11 has a main surface 113 (not illustrated) and a back surface 114. In addition, the SiC single crystal substrate 12 has a main surface 123 and a back surface 124 (not illustrated).

In the description of the present specification, the surface refers to both the main surface and the back surface. One surface refers to any one of the main surface and the back surface, and the other surface refers to a surface of the same substrate facing one surface.

In the description of the present specification, the growth layer 111 refers to a layer formed on the SiC single crystal substrate 11 that is not processed. The growth layer 121 refers to a layer formed on the SiC single crystal substrate 12 that is not processed.

On the surface of the growth layer formed on the surface of the SiC single crystal substrate, preferably, basal plane dislocation (BPD) density is reduced as much as possible. Therefore, the BPD density of the surface of the SiC single crystal substrate is preferably reduced as much as possible. In addition, in the formation of the growth layer, the BPD is preferably converted into other defects/dislocations including threading edge dislocation (TED).

<Heating Process>

The heating process according to the embodiment of the present invention includes a raw material transport process of heating the SiC single crystal substrates 11 and 12 and transporting a raw material from the SiC single crystal substrate 11 to the SiC single crystal substrate 12 as an example.

In this case, the raw material transport space S0 is formed between the SiC single crystal substrates 11 and 12.

In the heating process, as an example, the raw material transport space S0 having a temperature gradient is formed between the SiC single crystal substrates 11 and 12 so that one SiC single crystal substrate 11 is on the high temperature side and the other SiC single crystal substrate 12 is on the low temperature side.

Figure 1:
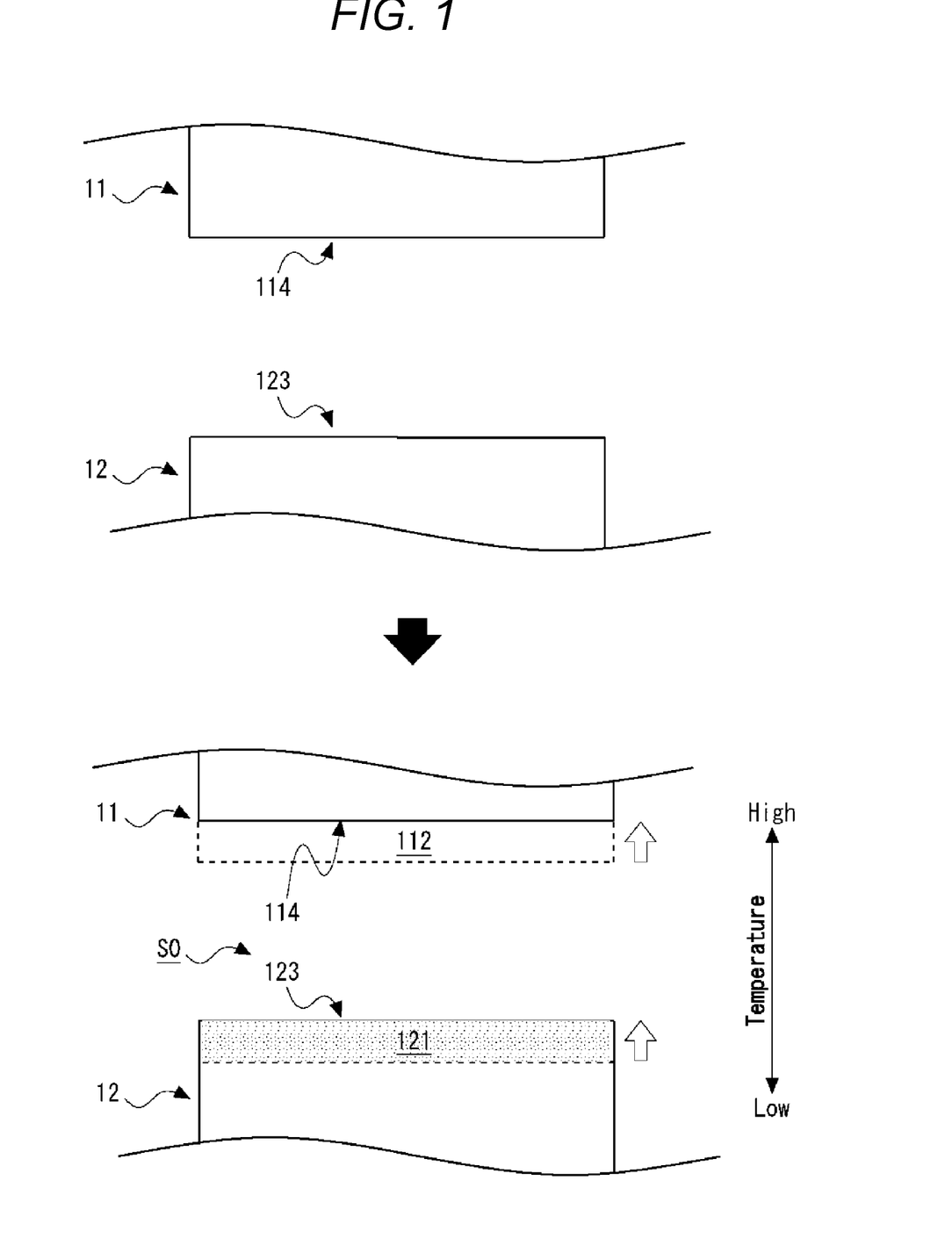
FIG. 1 is an explanatory view of a method for manufacturing an SiC substrate according to an embodiment of the present invention.

As illustrated in FIG. 1, when the SiC single crystal substrate 11 is on the high temperature side of the temperature gradient, the etching of one SiC single crystal substrate 11 (back surface 114) and the formation of the growth layer 121 on the other SiC single crystal substrate (main surface 123) are performed simultaneously.

Figure 2:
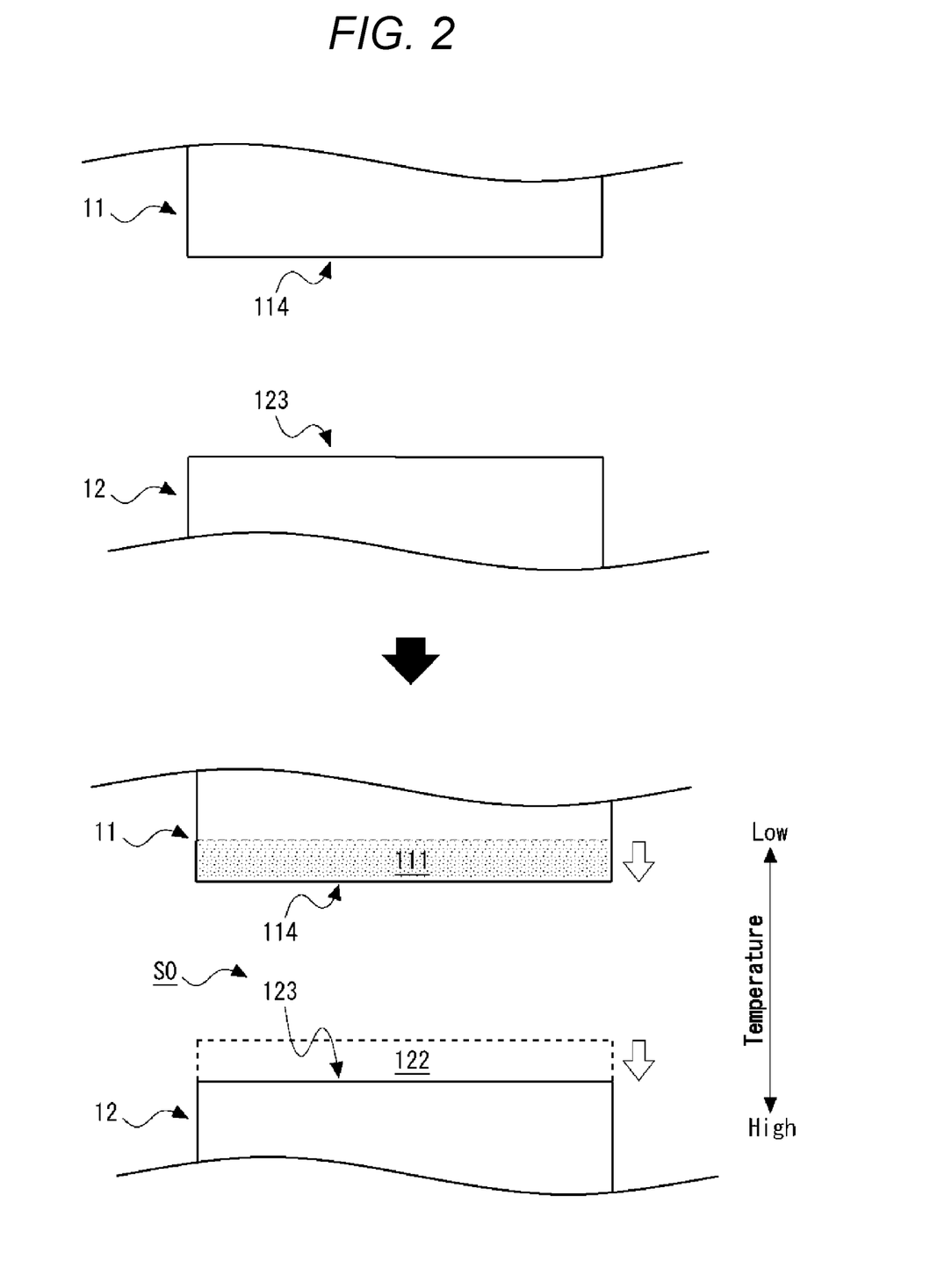
FIG. 2 is an explanatory view of the method for manufacturing an SiC substrate according to the embodiment of the present invention.

As illustrated in FIG. 2, the SiC single crystal substrate 11 is installed on the low temperature side of the temperature gradient, and thus, the formation of the growth layer 111 on the back surface 114 and the etching of the main surface 123 are simultaneously performed.

The heating process preferably heats the SiC single crystal substrates 11 and 12 in the quasi-closed space. Note that in the description of the present specification, the quasi-closed space refers to a space in which the inside of the space can be evacuated but at least a part of the vapor generated inside the space can be confined.

(Raw Material Transport Process)

Figure 3:
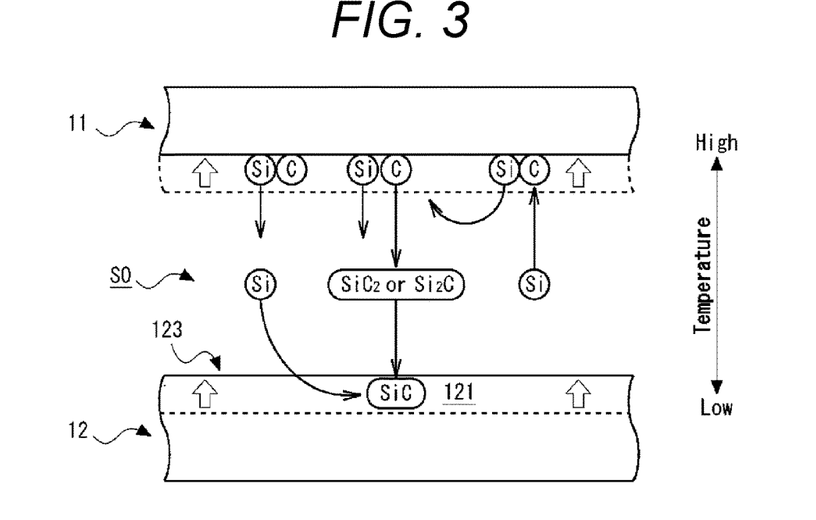
FIG. 3 is an explanatory view of the method for manufacturing an SiC substrate according to an embodiment of the present invention.

As illustrated in FIG. 3, in the raw material transport space S0 according to the embodiment of the present invention, it can be understood that the raw material transport is continuously performed based on the following reactions 1) to 5), and as an example, the growth layer 121 is formed.

1) $SiC(s) \rightarrow Si(v) + C(s)$
2) $2C(s) + Si(v) \rightarrow SiC_2(v)$
3) $C(s) + 2Si(v) \rightarrow Si_2C(v)$
4) $Si(v) + SiC_2(v) \rightarrow 2SiC(s)$
5) $Si_2C(v) \rightarrow Si(v) + SiC(s)$ Description of 1): When the back surface 114 of the SiC single crystal substrate 11 is thermally decomposed, Si atoms (Si(v)) are desorbed from the back surface 114.

Descriptions of 2) and 3): C(C(s)) remaining on the back surface 114 due to the desorption of Si atoms (Si(v)) reacts with Si vapor (Si(v)) in the raw material transport space S0 to become $Si_2C$, $SiC_2$, or the like and sublimate into the raw material transport space S0.

Description of 4) and 5): Sublimed $Si_2C$ or $SiC_2$, or the like reaches and diffuses into the terrace of the main surface 123 of the SiC single crystal substrate 12 due to the temperature gradient, and reaches the step, so the polymorph of the main surface 123 is taken over, and the growth layer 121 is grown and formed (step flow growth).

The raw material transport process includes an Si atom sublimation process of thermally sublimating Si atoms from the SiC single crystal substrate 11, and a C atom sublimation process of sublimating C atoms remaining on the back surface 114 of the SiC single crystal substrate 11 by bonding the C atoms to the Si atoms in the raw material transport space S0.

The raw material transport process includes an etching process of etching the surface of the SiC single crystal substrate as a transport source of the raw material based on the Si atom sublimation process and the C atom sublimation process.

The raw material transport process includes a growth process of forming the growth layer based on the step flow growth on the surface of the SiC single crystal substrate as a transport destination of the raw material.

In the growth process, it can be understood that $Si_2C$, $SiC_2$, or the like diffused in the raw material transport space S0 is supersaturated and coagulates at the transport destination.

It can be understood that the growth process is based on physical vapor transport.

It can be understood that a driving force of the raw material transport according to the embodiment of the present invention is a vapor pressure difference between the SiC single crystal substrates 11 and 12 due to the formed temperature gradient.

Therefore, not only the temperature difference on the surfaces of each of the SiC single crystal substrates 11 and 12 but also a chemical potential difference due to the crystal structures of the surfaces of the SiC materials or the like facing each other can be understood as the driving force of the raw material transport.

In the raw material transport according to the embodiment of the present invention, the transport source or the transport destination may not be the SiC single crystal substrate. Specifically, the SiC materials forming the quasi-closed space can be a transport source or a transport destination.

In the raw material transport according to the embodiment of the present invention, a doping concentration of the growth layer 111 can be adjusted by supplying a dopant gas into the quasi-closed space using a dopant gas supply means. On the other hand, when the dopant gas is not supplied, the growth layer 111 or 121 is formed by taking over the doping concentration in the quasi-closed space.

The raw material transport according to the embodiment of the present invention is preferably performed under the environment having gas phase species containing an Si element and gas phase species containing a C element, more preferably performed under an SiC—Si equilibrium vapor pressure environment, and more preferably performed under an SiC—C equilibrium vapor pressure environment.

In the description of the present specification, the SiC—Si vapor pressure environment refers to an environment of vapor pressure when SiC (solid) and Si (liquid phase) are in a phase equilibrium state via a gas phase. In addition, the SiC—C equilibrium vapor pressure environment refers to the vapor pressure environment when the SiC (solid phase) and the C (solid phase) are in a phase equilibrium state via the gas phase.

The SiC—Si equilibrium vapor pressure environment according to the embodiment of the present invention is formed by heating the quasi-closed space in which the atomic number ratio Si/C exceeds 1. In addition, the SiC—Si equilibrium vapor pressure environment according to the embodiment of the present invention is formed by heating the quasi-closed space in which the atomic number ratio Si/C is 1 or less.

The heating temperature according to the embodiment of the present invention is preferably set in a range of 1400 to 2300° C., and more preferably set in a range of 1600 to 2000° C.

The heating time according to the embodiment of the present invention can be set to any time so as to obtain a desired etching amount. For example, when the etching rate is 1 μm/min and the etching amount is set to be 1 μm, the heating time is 1 minute.

The temperature gradient according to the embodiment of the present invention is set, for example, in a range of 0.1 to 5° C./mm.

The temperature gradient according to the embodiment of the present invention is preferably uniform in the raw material transport space S0.

The etching amount and the growth amount according to the embodiment of the present invention are, for example, in a range of 0.1 to 20 μm, but are appropriately changed as necessary.

The etching rate and the growth rate of the growth layer according to the embodiment of the present invention can be controlled by the temperature region, and can be set in a range of, for example, 0.001 to 2 μm/min.

It can be understood that the etching amount and the growth amount according to the embodiment of the present invention are equivalent.

It can be understood that the heating process according to the embodiment of the present invention includes a bunching decomposition process of decomposing and suppressing the formation of the MSB on the surface of the SiC single crystal substrate based on the etching process.

The surface layer on the SiC single crystal substrate etched in the etching process according to the embodiment of the present invention can be understood as a strain layer E211 into which processing damage such as scratches, latent scratches, and distortion is introduced through mechanical processing (for example, slicing, grinding, and polishing) or laser processing, for example.

<<Apparatus for Manufacturing SiC Substrate>>

Hereinafter, an apparatus for manufacturing a SiC substrate (hereinafter, simply referred to as a manufacturing apparatus) according to an embodiment of the present invention will be described in detail with reference to FIGS. 4 to 5. Note that constituent elements that are basically the same as those described in the above manufacturing method are denoted by the same reference numerals, and the description thereof will be simplified.

Figure 4:
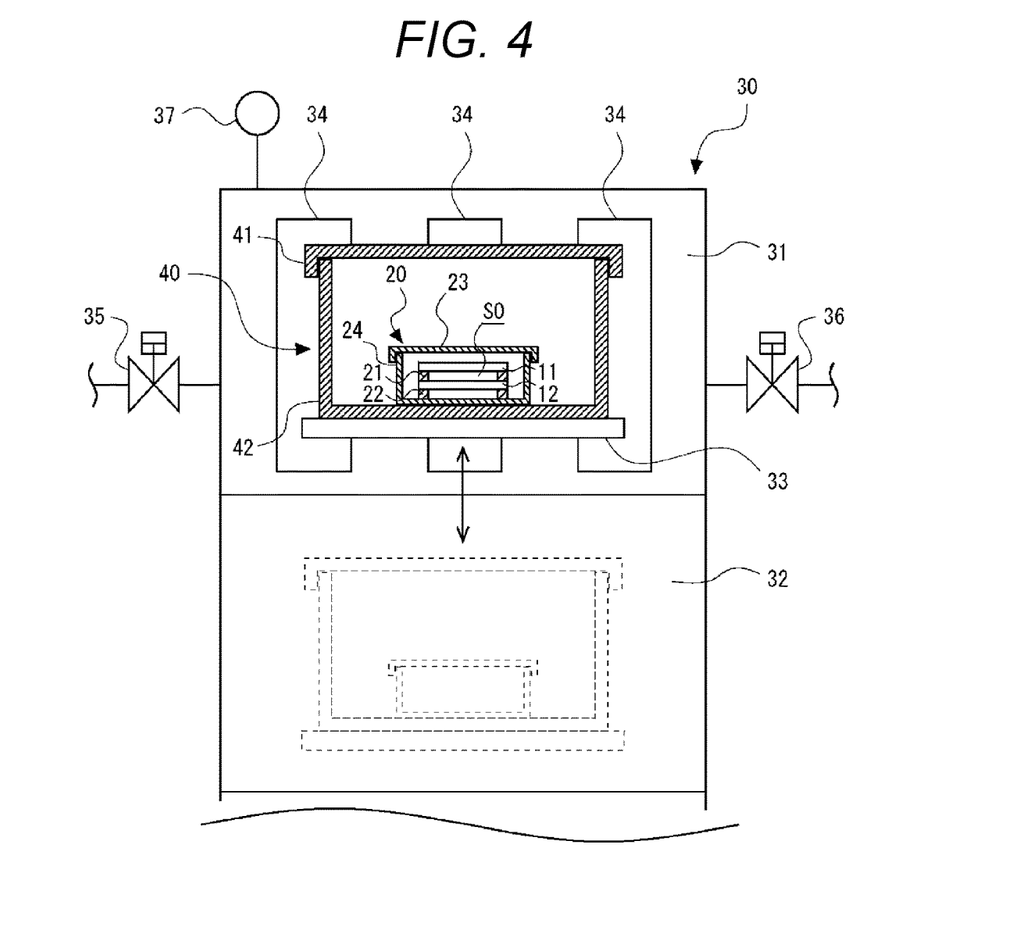
FIG. 4 is an explanatory view of an apparatus for manufacturing an SiC substrate according to an embodiment of the present invention.

As illustrated in FIG. 4, the manufacturing apparatus includes a main container 20, a heating furnace 30, and a high melting point container 40.

<Main Container>

The main container 20 may be configured to house the SiC single crystal substrates 11 and 12 and generate vapor pressures of a gas phase species containing an Si element and a gas phase species containing a C element in the internal space during the heat treatment.

The main container 20 is made of, for example, a material containing SiC polycrystal. In the embodiment of the present invention, the entire main container 20 is made of SiC polycrystal. Therefore, at least a part of the main container 20 can be a transport source or a transport destination in raw material transport.

It is preferable that the environment in the heat-treated main container 20 is the vapor pressure environment of the mixed system of the gas phase species containing the Si element and the gas phase species containing the C element. Examples of the gas phase species containing the Si element can include Si, $Si_2$, $Si_3$, $Si_2C$, $SiC_2$, and SiC. In addition, examples of the gas phase species containing the C element include $Si_2C$, $SiC_2$, SiC, and C.

The dopant and doping concentration of the main container 20 can be selected according to the dopant and doping concentration of the growth layer 111 or 121 to be formed. Examples of the dopant include an N element.

In addition, the structure can be adopted as long as the vapor pressure of the gas phase species containing the Si element and the gas phase species containing the C element is generated in the internal space during the heat treatment of the main container 20. As an example, a configuration in which the SiC polycrystal is exposed on a part of the inner surface, a configuration in which the SiC polycrystal is separately installed in the main container 20, and the like can be illustrated.

As illustrated in FIG. 4, the main container 20 is a fitting container including an upper container 23 and a lower container 24 that can be fitted to each other. A minute gap 25 is formed in a fitting portion between the upper container 23 and the lower container 24, and the inside of the main container 20 can be exhausted (evacuated) from the gap 25.

The main container 20 has the raw material transport space S0 formed between the SiC single crystal substrates 11 and 12. The raw material transport space S0 is exhausted via the Si vapor pressure space (see FIG. 5 and the like). The raw material transport mechanism in the raw material transport space S0 is as described above.

<Si Vapor Supply Source>

Figure 5:
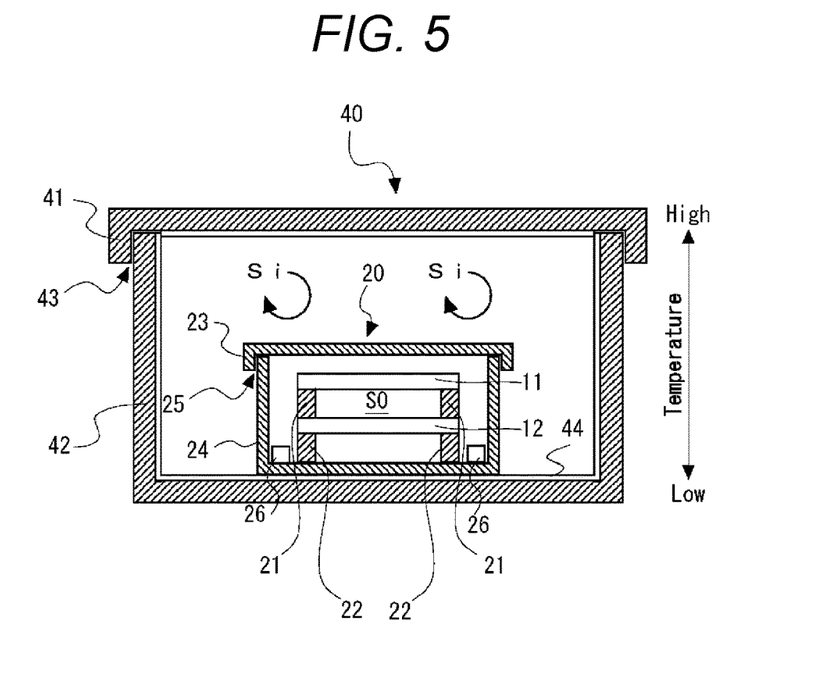
FIG. 5 is an explanatory view of the apparatus for manufacturing an SiC substrate according to the embodiment of the present invention.

The main container 20 includes an Si vapor supply source 26 (not illustrated in FIG. 4, and illustrated in FIG. 5). The Si vapor supply source 26 is used for the purpose of adjusting an atomic number ratio Si/C of the quasi-closed space in the main container 20 to exceed 1. Examples of the Si vapor supply source can include solid Si (Si pellet such as Si piece or Si powder) and an Si compound.

For example, as in an embodiment of the present invention, when the entire main container 20 is made of SiC polycrystal, the atomic number ratio Si/C in the main container 20 exceeds 1 by installing the Si vapor supply source 26. Specifically, when the SiC single crystal substrates 11 and 12 satisfying a stoichiometric ratio 1:1 and the Si vapor supply source 26 are installed in the SiC polycrystal main container 20 satisfying the stoichiometric ratio 1:1, the atomic number ratio Si/C in the main container 20 exceeds 1.

The SiC—Si equilibrium vapor pressure environment according to the embodiment of the present invention is formed by heating the quasi-closed space in which the atomic number ratio Si/C exceeds 1. In addition, the SiC—Si equilibrium vapor pressure environment according to the embodiment of the present invention is formed by heating the quasi-closed space in which the atomic number ratio Si/C is 1 or less.

<Installation Tool>

The installation tools 21 and 22 may have any configuration as long as at least a part of the SiC single crystal substrate 11 can be held in a hollow space of the main container 20. As an example, any conventional support means such as one-point support, three-point support, a configuration for supporting an outer peripheral edge, and a configuration for clamping a part thereof can be naturally adopted. The material of the installation tools 21 and 22 is preferably an SiC material. In the embodiment of the present invention, the case of using the installation tools 21 and 22 is exemplified, but it is a matter of course that the SiC single crystal substrates 11 and 12 can be installed so as to face each other only by the installation tools 21.

The installation tools 21 and 22 hold the SiC single crystal substrates 11 and 12 so that the SiC single crystal substrates 11 and 12 are adjacent to each other and are substantially parallel to each other.

The installation tools 21 and 22 hold the SiC single crystal substrates 11 and 12 so that the SiC single crystal substrates 11 and 12 are separated by a predetermined distance. In this case, the predetermined distance is preferably 100 mm or less, more preferably 50 mm or less, more preferably 20 mm or less, more preferably 10 mm or less, still more preferably 7 mm or less, still more preferably 5 mm or less, still more preferably 3.5 mm or less, still more preferably 3 mm or less, and still more preferably 2.7 mm or less. The predetermined distance is preferably greater than or equal to 0.7 mm, more preferably greater than or equal to 1.0 mm, more preferably greater than or equal to 1.2 mm, still more preferably greater than or equal to 1.5 mm, and still more preferably greater than or equal to 1.7 mm.

<Heating Furnace>

The heating furnace 30 is configured to perform heating so as to form the temperature gradient so that the temperature decreases/increases from the upper container 23 toward the lower container 24 of the main container 20. As a result, the temperature gradient is formed in the thickness direction of the SiC single crystal substrate 11. Therefore, as an example, the raw material transport space S0 can be formed by providing the installation tool 21 between the SiC single crystal substrates 11 and 12 and providing the installation tool 22 between the SiC single crystal substrate 12 and the lower container 24.

As illustrated in FIG. 4, the heating furnace 30 includes a main heating chamber 31 capable of heating objects to be processed (SiC single crystal substrates 11 and 12 and the like) to a temperature of 1000° C. or higher and 2300° C. or lower, a spare chamber 32 capable of preheating the objects to be processed to a temperature of 500° C. or higher, a high melting point container 40 capable of housing the main container 20, and a moving means 33 (moving table) capable of moving the high melting point container 40 from the spare chamber 32 to the main heating chamber 31.

The main heating chamber 31 has a regular hexagonal shape in a planar cross-sectional view, and the high melting point container 40 has heating chamber disposed therein.

A heater 34 (mesh heater) is provided in the main heating chamber 31. In addition, a multilayer heat reflective metal plate is fixed to a side wall and a ceiling of the main heating chamber 31 (not illustrated). The multilayer heat reflective metal plate is configured to reflect the heat of the heater 34 toward a substantially central portion of the main heating chamber 31.

The heater 34 is disposed in the main heating chamber 31 so as to surround the high melting point container 40 in which the objects to be processed is housed. In this case, the multilayer heat reflective metal plate is installed outside the heater 34, so that the temperature can be raised in the temperature range of 1000° C. or more and 2300° C. or less.

As an example of the heater 34, a resistance heating type heater or a high frequency induction heating type heater can be adopted.

The heater 34 may adopt a configuration capable of forming the temperature gradient in the high melting point container 40.

As an example, the heater 34 may be configured so that many heaters are installed on the upper side (or lower side). Further, the heater 34 may be configured so that the width increases toward the upper side (or lower side). Alternatively, the heater 34 may be configured to be able to increase the power supplied toward the upper side (or lower side).

A vacuum forming valve 35 that exhausts the inside of the main heating chamber 31, an inert gas injection valve 36 that introduces an inert gas into the main heating chamber 31, and a vacuum gauge 37 for measuring the degree of vacuum in the main heating chamber 31 are connected to the main heating chamber 31.

The vacuum forming valve 35 is connected to a vacuum drawing pump that evacuates and draws a vacuum from the inside of the main heating chamber 31 (not illustrated). The degree of vacuum in the main heating chamber 31 can be adjusted to preferably 10 Pa or less, more preferably 1 Pa or less, and most preferably $10^{-3}$ Pa or less by the vacuum forming valve 35 and the vacuum drawing pump. Examples of the vacuum pump can include a turbo molecular pump.

The inert gas injection valve 36 is connected to an inert gas supply source (not illustrated).

By the inert gas injection valve 36 and the inert gas supply source, an inert gas can be introduced into the main heating chamber 31 in the range of $10^{-5}$ to $10^4$ Pa. As the inert gas, Ar or the like can be selected.

The inert gas injection valve 36 is a dopant gas supply means capable of supplying a dopant gas into the main container 20. That is, by selecting the dopant gas (for example, $N_2$ or the like) as the inert gas, the doping concentration of the growth layer 111 can be increased.

The spare chamber 32 is connected to the main heating chamber 31, and is configured so that the high melting point container 40 can be moved by the moving means 33. Note that the temperature of the spare chamber 32 according to the present embodiment can be raised by residual heat of the heater 34 of the main heating chamber 31. As an example, when the temperature of the main heating chamber 31 is raised to 2000° C., the temperature of the spare chamber 32 is raised to about 1000° C., and the objects to be processed (SiC single crystal substrate 11 or main container 20, high melting point container 40, and the like) can be degassed.

The moving means 33 is configured to be movable between the main heating chamber 31 and the spare chamber 32 with the high melting point container 40 mounted thereon.

The conveyance between the main heating chamber 31 and the spare chamber 32 by the moving means 33 is completed in about 1 minute at the shortest, and thus, temperature rising and temperature falling at 1 to 1000° C./min can be realized. As a result, since rapid temperature rising and rapid temperature falling can be performed, it is possible to observe a surface shape having no low-temperature growth history during temperature rising and temperature falling. In addition, in FIG. 4, the spare chamber 32 is installed under the main heating chamber 31, but the present invention is not limited thereto, and the spare chamber 32 may be installed in any direction.

The moving means 33 according to the present embodiment is a moving table on which the high melting point container 40 is mounted. The contact portion of the moving table and the high melting point container 40 becomes a heat propagation path. As a result, the temperature gradient can be formed in the high melting point container 40 so that the contact portion side of the moving table and the high melting point container 40 becomes the low temperature side.

In the heating furnace 30 according to the present embodiment, since the bottom portion of the high melting point container 40 is in contact with the moving table, the temperature gradient is provided so that the temperature decreases from the upper container 41 toward the lower container 42 of the high melting point container 40.

The direction of the temperature gradient can be set to any direction by changing the position of the contact portion of the moving table and the high melting point container 40. As an example, in a case where a suspension type or the like is adopted for the moving table and the contact portion is provided on the ceiling of the high melting point container 40, heat escapes upward. Therefore, the temperature gradient is provided so that the temperature rises from the upper container 41 toward the lower container 42 of the high melting point container 40. Note that the temperature gradient is preferably formed along the thickness direction of the SiC single crystal substrates 11 and 12. In addition, as described above, the temperature gradient may be formed by the configuration of the heater 34.

<High Melting Point Container>

The vapor pressure environment of the gas phase species containing the Si element in the heating furnace 30 according to the present embodiment is formed using the high melting point container 40 and the Si vapor supply material 44. As an example, a method capable of forming a vapor pressure environment of a vapor phase species containing an Si element around the main container 20 can be adopted in the apparatus for manufacturing an SiC substrate of the present invention.

The high melting point container 40 is preferably configured to contain a high melting point material having a melting point equal to or higher than the melting point of the material constituting the main container 20.

Examples of the high melting point container 40 can include C which is a general purpose heat resistant member, W, Re, Os, Ta, and Mo which are high melting point metals, $Ta_9C_8$, HfC, TaC, NbC, ZrC, $Ta_2C$, TiC, WC, and MoC which are carbides, HfN, TaN, BN, $Ta_2N$, ZrN, and TiN which are nitrides, $HfB_2$, $TaB_2$, $ZrB_2$, $NB_2$, and $TiB_2$ which are borides, and SiC polycrystals, and the like.

As illustrated in FIG. 5, similarly to the main container 20, the high melting point container 40 is a fitting container including an upper container 41 and a lower container 42 that can be fitted to each other, and is configured to be able to house the main container 20. The minute gap 43 is formed in the fitting portion between the upper container 41 and the lower container 42, and the inside of the high melting point container 40 can be exhausted (evacuated) from the gap 43.

The high melting point container 40 includes a Si vapor supply material 44 capable of supplying the vapor pressure of the vapor phase species containing the Si element into the high melting point container 40.

<Si Vapor Supply Material>

The Si vapor supply material 44 may have any configuration as long as the Si vapor is generated in the high melting point container 40 during heat treatment, and the solid Si (Si pellet such as Si piece or Si powder) or the Si compound can be exemplified as an example.

The Si vapor supply material 44 is, by way of example, a thin film that covers the inner wall of high melting point container 40.

When the high melting point container 40 is a metal compound such as TaC, the Si vapor supply material 44 is, for example, a Silicide material of metal atoms and Si atoms constituting the high melting point container 40.

Since the high melting point container 40 has the Si vapor supply material 44 inside, it is possible to hold the vapor pressure environment of the gas phase species containing the Si element in the main container 20. It can be understood that this is because the vapor pressure of the gas phase species containing the Si element in the main container 20 and the vapor pressure of the gas phase species containing the Si element outside the main container 20 are balanced.

Reference Example 1 to 3 is shown below.

Reference Example 1

Under the following conditions, the SiC single crystal substrate E10 was housed in the main container 20, and furthermore, the main container 20 was housed in the high melting point container 40.

<SiC Single Crystal Substrate E10>
Polymorph: 4H—SiC
Substrate size: Horizontal width (10 mm), vertical width (10 mm), and thickness (0.3 mm)
Off direction and Off angle: <11-20> direction 4° off
Growth surface: (0001) surface
Presence or absence of MSB: Absence <Main Container 20>
Material: SiC polycrystal
Container size: Diameter (60 mm), height (4 mm)
Distance between SiC single crystal substrate E10 and SiC material: 2 mm
Atomic number ratio Si/C in container: 1 or less
<High Melting Point Container 40>
Material: TaC
Container size: Diameter (160 mm), height (60 mm)
Si vapor supply material 44 (Si compound): $TaSi_2$ The SiC single crystal substrate E10 disposed under the above conditions was subjected to a heat treatment under the following conditions.

Figure 6:
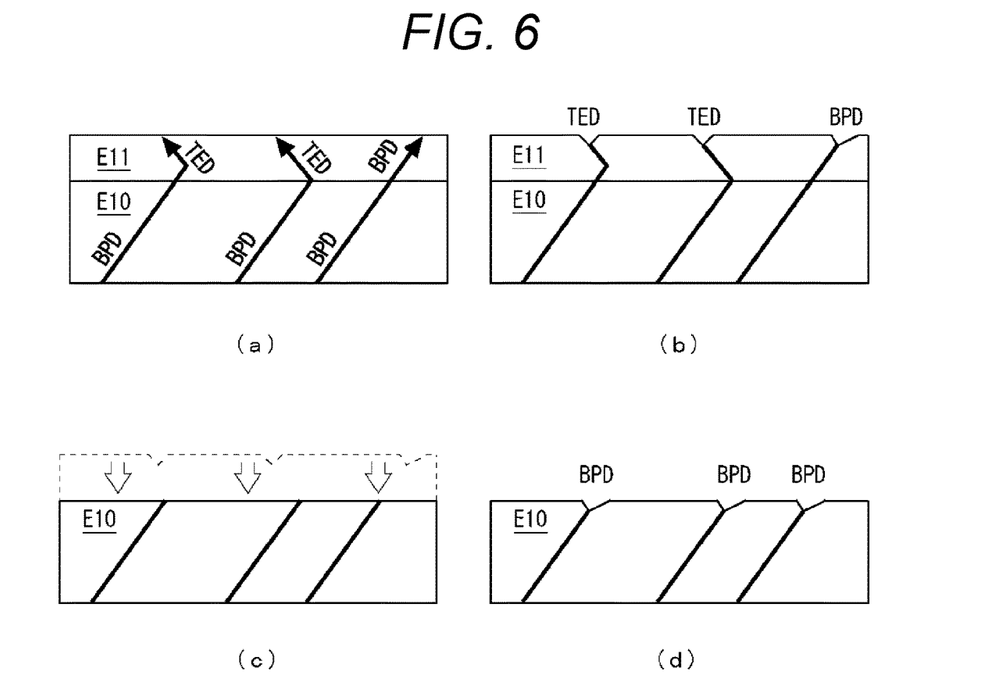
FIG. 6 is an explanatory view related to evaluation of the number of BPDs in an SiC substrate in Reference Example 1.

Heating temperature: 1700° C.
Heating time: 300 min
Temperature gradient: 1° C./mm
Growth rate: 5 nm/min
Degree of vacuum of main heating chamber 31: $10^{-5}$ Pa FIG. 6 is an explanatory diagram of a method for obtaining a conversion rate obtained by converting BPD into another defect/dislocation (TED or the like) in a growth layer E11.

FIG. 6(a) illustrates a state in which the growth layer E11 is grown by the heating process. In the heating process, the BPD existing in the SiC single crystal substrate E10 is converted into TED with a certain probability. Therefore, unless 100% conversion is performed, the TED and the BPD are mixed on the surface of the growth layer E11.

FIG. 6(b) illustrates a state in which a defect in the growth layer E11 is confirmed using the KOH dissolution etching method. This KOH dissolution etching method is a method of immersing the SiC single crystal substrate E10 in a dissolved salt (KOH or the like) heated to about 500° C., forming etch pits in dislocations or defect portions, and determining a type of dislocations on the basis of the size and shape of the etch pits. By this method, the number of BPDs existing on the surface of the growth layer E11 is obtained.

FIG. 6(c) illustrates a state in which the growth layer E11 is removed after the KOH dissolution etching In this method, after planarized to the depth of the etch pit by mechanical polishing, CMP, or the like, the growth layer E11 is removed by thermal etching to expose the surface of the SiC single crystal substrate E10.

FIG. 6(d) illustrates a state in which the defects in the SiC single crystal substrate E10 are confirmed using the KOH dissolution etching method with respect to the SiC single crystal substrate E10 from which the growth layer E11 has been removed. By this method, the number of BPDs existing on the surface of the SiC single crystal substrate E10 is obtained.

By comparing the number of BPDs existing on the surface of the growth layer E11 (see FIG. 6(b)) with the number of BPDs existing on the surface of the SiC single crystal substrate E10 (FIG. 6(d)) in the series of order illustrated in FIG. 6, it is possible to obtain the BPD conversion rate converted from BPD to other defects/dislocations during the heating process.

The number of BPDs existing on the surface of the growth layer E11 of Reference Example 1 was about 0 $cm^{-2}$, and the number of BPDs existing on the surface of the SiC single crystal substrate E10 was 1000 $cm^{-2}$.

That is, it can be understood that the BPD is reduced or removed by disposing the SiC single crystal substrate E10 having no MSB on the surface in the quasi-closed space in which the atomic number ratio Si/C is 1 or less and heating the SiC single crystal substrate E10.

In Reference Example 1, the SiC—C equilibrium vapor pressure environment is formed in the main container 20 so that the atomic number ratio Si/C in the main container 20 is 1 or less.

Since the heating process including the etching process in the above method and the heating process including the etching process according to the embodiment of the present invention are based on the same reaction element process, it can be understood that BPD can be reduced or removed even in the etching process according to the embodiment of the present invention Reference Example 2

Under the following conditions, the SiC single crystal substrate E10 was housed in the main container 20, and furthermore, the main container 20 was housed in the high melting point container 40.

<SiC Single Crystal Substrate E10>
Polymorph: 4H—SiC
Substrate size: Horizontal width (10 mm), vertical width (10 mm), and thickness (0.3 mm)
Off direction and Off angle: <11-20> direction 4° off
Growth surface: (0001) surface
Presence or absence of MSB: Presence
<Main Container 20>
Material: SiC polycrystal
Container size: Diameter (60 mm), height (4 mm)
Distance between SiC single crystal substrate E10 and SiC material: 2 mm
Si vapor supply source 26: Si piece
Atomic number ratio Si/C in container: more than 1

By housing the Si piece together with the SiC single crystal substrate in the main container 20, the atomic number ratio Si/C in the container exceeds 1.

<High Melting Point Container 40>
Material: TaC
Container size: Diameter (160 mm)×height (60 mm)
Si vapor supply material 44 (Si compound): $TaSi_2$ The SiC single crystal substrate E10 disposed under the above conditions was subjected to a heat treatment under the following conditions.

Figure 7:
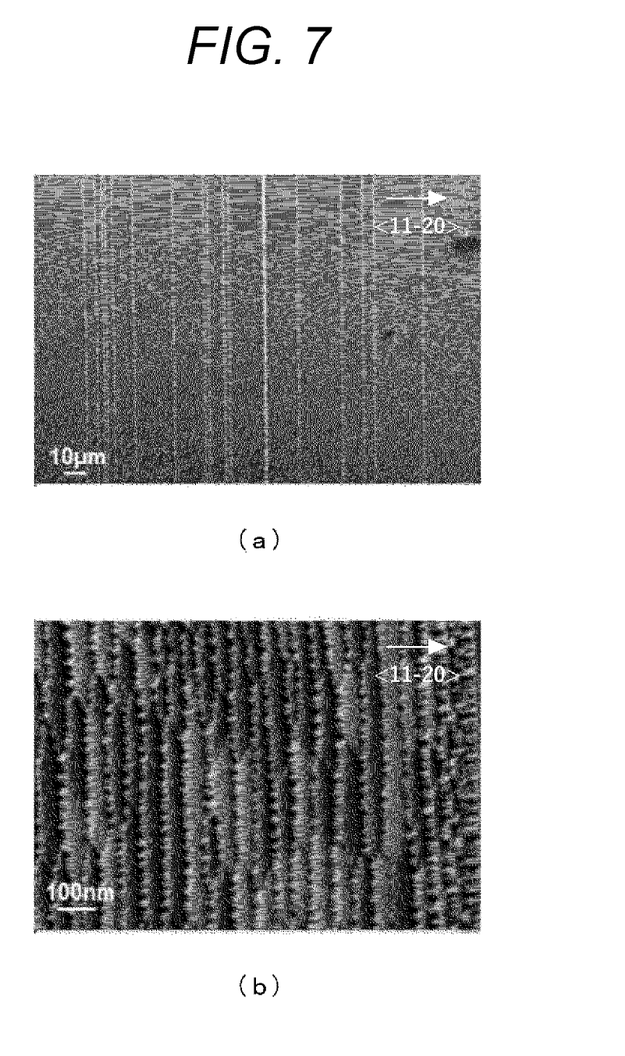
FIG. 7 is the SEM image of a surface of the SiC substrate in Reference Example 2.

Heating temperature: 1800° C.
Heating time: 60 min
Temperature gradient: 1° C./mm
Growth rate: 68 nm/min
Degree of vacuum of main heating chamber 31: $10^{-5}$ Pa FIG. 7 is an SEM image of the surface of the SiC single crystal substrate E10 before the growth of the growth layer E11. FIG. 7(a) is a SEM image observed at a magnification ×1000, and FIG. 7(b) is a SEM image observed at a magnification ×100,000.

It can be understood that the MSB is formed on the surface of the SiC single crystal substrate E10 before the growth of the growth layer E11, and steps having a height of 3 nm or more are arranged with a terrace width of 42 nm on average. Note that the step height was measured by AFM.

Figure 8:
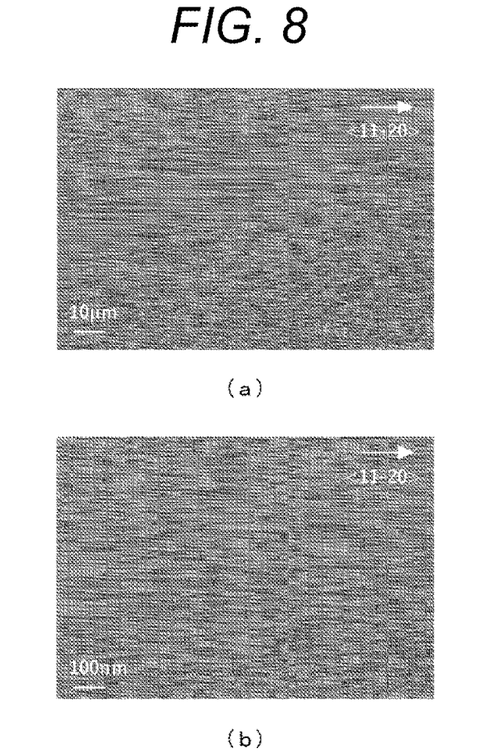
FIG. 8 is the SEM image of a surface of the SiC substrate in Reference Example 2.

FIG. 8 is an SEM image of the surface of the SiC single crystal substrate E10 after the growth of the growth layer E11. FIG. 8(a) is a SEM image observed at a magnification ×1000, and FIG. 8(b) is a SEM image observed at a magnification ×100,000.

It can be understood that the MSB is not formed on the surface of the growth layer E11 of Reference Example 2, and steps of 1.0 nm (full unit cell) are regularly arranged with a terrace width of 14 nm. Note that the step height was measured by AFM.

Therefore, it can be understood that the growth layer E11 in which the MSB is decomposed is formed by disposing the SiC single crystal substrate E10 in which the MSB exists on the surface in the quasi-closed space in which the atomic number ratio Si/C exceeds 1 and heating the SiC single crystal substrate E10.

In Reference Example 2, since the Si vapor supply source 26 is installed so that the atomic number ratio Si/C in the main container 20 exceeds 1, the SiC—Si equilibrium vapor pressure environment is formed in the main container 20.

Since the heating process including the etching process in the above method and the heating process including the etching process according to the embodiment of the present invention are based on the same reaction element process, it can be understood that the MSB on the surface of the SiC single crystal substrate can be decomposed even in the etching process according to the embodiment of the present invention.

Reference Example 3

Figure 9:
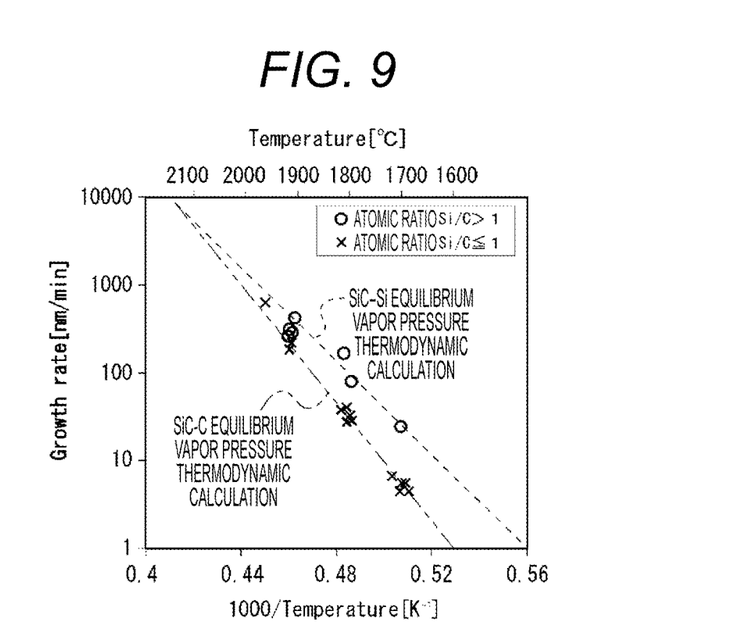
FIG. 9 is a correlation diagram between a growth rate and a heating temperature of the SiC substrate in Reference Example 3.

FIG. 9 is a graph illustrating the relationship between the heating temperature and the growth rate of the SiC single crystal substrate grown by the method of manufacturing an SiC single crystal substrate according to the present invention. A horizontal axis of the graph represents a reciprocal of the temperature, and a vertical axis of the graph represents the growth rate in logarithmic form. A result of growing the growth layer E11 on the SiC single crystal substrate E10 by disposing the SiC single crystal substrate E10 in the space (in the main container 20) in which the atomic number ratio Si/C exceeds 1 is indicated by O mark. In addition, the result of growing the growth layer E11 on the SiC single crystal substrate E10 by disposing the SiC single crystal substrate E10 in the space (in the main container 20) in which the atomic number ratio Si/C is 1 or less is indicated by x mark.

In addition, in the graph of FIG. 9, the result of the thermodynamic calculation of the SiC substrate growth in the SiC—Si equilibrium vapor pressure environment is indicated by a broken line (Arrhenius plot), and the result of the thermodynamic calculation of the SiC substrate growth in the SiC—C equilibrium vapor pressure environment is indicated by a two-dot chain line (Arrhenius plot).

In the present method, the SiC single crystal substrate E10 is grown using a chemical potential difference or a temperature gradient as a growth driving force under the condition that the vapor pressure environment between the SiC raw material and the SiC substrate is the SiC—C equilibrium vapor pressure environment or the SiC—C equilibrium vapor pressure environment. This chemical potential difference can be exemplified by a partial pressure difference between the gas phase species generated on the surfaces of the SiC polycrystal and the SiC single crystal.

Here, when the partial pressure difference of the vapor generated from the SiC raw material (transport source) and the SiC substrate (transport destination) is defined as the growth amount, the SiC growth rate is obtained by the following Equation 1.

[Equation 1]

Here, T is a temperature on the SiC raw material side, $m_i$ is a molecular weight of a gas phase species ($Si_xC_y$), and k is a Boltzmann constant.

In addition, the $P_{transport\ source\ i} - P_{transport\ destination\ i}$ is a growth amount in which the raw material gas is supersaturated and precipitated as SiC, and SiC, $Si_2C$, and $SiC_2$ are assumed as the raw material gas.

That is, the broken line indicates the result of the thermodynamic calculation when an SiC single crystal is grown using SiC polycrystal as a raw material in the vapor pressure environment when SiC (solid) and Si (liquid phase) are in the phase equilibrium state via the gas phase.

Specifically, using Equation 1, the thermodynamic calculation was performed under the following conditions (i) to (iv). (i) The SiC—Si equilibrium vapor pressure environment in which a volume is constant, (ii) the temperature gradient in the main container 20 and the vapor pressure difference (chemical potential difference) between the SiC polycrystal and the SiC single crystal, (iii) SiC, $Si_2C$, or $SiC_2$ as the raw gas, and (iv) an adsorption coefficient at which the source material is adsorbed to the step of the SiC single crystal substrate E10 is 0.001.

In addition, the two-dot chain line is a result of the thermodynamic calculation when the SiC single crystals are grown using SiC polycrystals as raw materials in the vapor pressure environment when the SiC (solid phase) and the C (solid phase) are in the phase equilibrium state via the gas phase.

Specifically, using Equation 1, the thermodynamic calculation was performed under the following conditions (i) to (iv). (i) The SiC—C equilibrium vapor pressure environment in which a volume is constant, (ii) growth driving force is the temperature gradient in the main container 20 and the vapor pressure difference (chemical potential difference) between the SiC polycrystal and the SiC single crystal, (iii) SiC, $Si_2C$, or $SiC_2$ as the raw gas, and (iv) an adsorption coefficient at which the source material is adsorbed to the step of the SiC single crystal substrate E10 is 0.001.

Note that as data of each chemical species used for the thermodynamic calculation, values in a JANAF thermochemical table were adopted.

According to the graph of FIG. 9, it is found that the result (O mark) of growing the growth layer E11 on the SiC single crystal substrate E10 by disposing the SiC single crystal substrate E10 in the space (inside the main container 20) in which the atomic number ratio Si/C exceeds 1 is consistent with the result of the thermodynamic calculation of the SiC growth in the SiC—Si equilibrium vapor pressure environment.

In addition, it can be understood that the result (x mark) of growing the growth layer E11 on the SiC single crystal substrate E10 by disposing the SiC single crystal substrate E10 in the space (in the main container 20) in which the atomic number ratio Si/C is 1 or less is consistent with the result of the thermodynamic calculation of the SiC growth in the SiC—C equilibrium vapor pressure environment.

Under the SiC—Si equilibrium vapor pressure environment, it is estimated that a growth rate of 1.0 μm/min or more is achieved at a heating temperature of 1960° C. In addition, it is estimated that a growth rate of 2.0 μm/min or more is achieved at a heating temperature of 2000° C. or more.

On the other hand, under the SiC—C equilibrium vapor pressure environment, it is estimated that a growth rate of 1.0 μm/min or more is achieved at a heating temperature of 2000° C. In addition, it is estimated that a growth rate of 2.0 μm/min or more is achieved at a heating temperature of 2030° C. or higher.

According to the present invention, each of the etching and growth layer formation on the surface of the SiC single crystal substrate can be freely performed by adjusting heating conditions without changing the atmosphere. As a result, the SiC semiconductor process can be optimized.

In addition, according to the present invention, since etching is performed on the other side of the SiC single crystal substrate while the growth layer is formed on one side of the SiC single crystal substrate, it is possible to manufacture the SiC substrate in which the underlying substrate layer immediately below the growth layer is thin while suppressing deformation and breakage of the SiC single crystal substrate.

In addition, according to the present invention, the surface of the SiC single crystal substrate is etched under the SiC—Si equilibrium vapor pressure environment, so it is possible to suppress the formation of the MSB, and manufacture the SiC single crystal substrate whose surface is planarized.

In addition, according to the present invention, the surface of the SiC single crystal substrate is epitaxially grown under the SiC—C equilibrium vapor pressure environment, so it is possible to manufacture the SiC single crystal substrate having a BPD-free growth layer that suitably functions as a withstand voltage layer of the SiC semiconductor device.

REFERENCE SIGNS LIST

S0 Raw material transport space
11, 12, E10 SiC single crystal substrate
113, 123 Main surface
114, 124 Back surface
111, 121, E11 Growth layer
20 Main container
21, 22 Installation tool
23, 41 Upper container
24, 42 Lower container
25, 43 Gap
26 Si vapor supply source
30 Heating furnace
40 High melting point container
44 Si vapor supply material

The invention claimed is:

1. A method for manufacturing a SiC substrate, comprising:
disposing two SiC single crystal substrates facing each other in a main container made of a SiC material, and performing simultaneously the following transporting of a raw material by heating the main container,
transporting a raw material from one side of one SiC single crystal substrate to one side of the other SiC single crystal substrate, performing an etching of the one side of the one SiC single crystal substrate and a formation of a growth layer on the one side of the other SiC single crystal substrate,
transporting a raw material from the main container to an other side of the one SiC single crystal substrate, performing a formation of a growth layer on the other side of the one SiC single crystal substrate, and
transporting a raw material from an other side of the other SiC single crystal substrate to the main container, performing an etching of the other side of the other SiC single crystal substrate.

2. The manufacturing method according to claim 1, wherein
the two SiC single crystal substrates are heated so that the one SiC single crystal substrate is on a high temperature side and the other SiC single crystal substrate is on a low temperature side, therefore the etching of the one SiC single crystal substrate and the formation of the growth layer on the other SiC single crystal substrate are performed simultaneously.

3. The manufacturing method according to claim 1, wherein
a quasi-closed space is formed in the main container, and the two SiC single crystal substrates are disposed and heated in the quasi-closed space.

4. The manufacturing method according to claim 3, wherein
the two SiC single crystal substrates are disposed and heated in the quasi-closed space in which an atomic number ratio Si/C exceeds 1.

5. The manufacturing method according to claim 3, wherein
the two SiC single crystal substrates are disposed and heated in the quasi-closed space in which the atomic number ratio Si/C is equal to or less than 1.

6. The manufacturing method according to claim 1, wherein
the main container are housed in a heating furnace including a heater, and
the main container containing the two SiC single crystal substrates is heated in the heating furnace by the heater.

7. The manufacturing method according to claim 1, wherein
the main container is exhausted via an Si vapor pressure space.

8. The manufacturing method according to claim 1, wherein
the two SiC single crystal substrates are disposed parallel to each other by being supported by an installation tool made of material comprised of Si and C atoms.

9. The manufacturing method according to claim 1, wherein
the two SiC single crystal substrates are heated under an SiC—Si vapor pressure environment.

10. The manufacturing method according to claim 9, wherein
the SiC—Si vapor pressure environment is formed by heating a quasi-closed space in which the atomic number ratio Si/C exceeds 1.

11. The manufacturing method according to claim 1, wherein
the two SiC single crystal substrates are heated under an SiC—C vapor pressure environment.

12. The manufacturing method according to claim 11, wherein
the SiC—C vapor pressure environment is formed by heating a quasi-closed space in which the atomic number ratio Si/C is 1 or less.

* * * * *